United States Patent
Kato et al.

(10) Patent No.: US 6,764,743 B2
(45) Date of Patent: Jul. 20, 2004

(54) POROUS HONEYCOMB STRUCTURE AND PROCESS FOR PRODUCTION THEREOF

(75) Inventors: Yasushi Kato, Nagoya (JP); Yasushi Noguchi, Nagoya (JP); Masato Ogawa, Komaki (JP)

(73) Assignee: NGK Insulators, Ltd., Nagoya (JP)

( * ) Notice: Subject to any disclaimer, the term of this patent is extended or adjusted under 35 U.S.C. 154(b) by 11 days.

(21) Appl. No.: 10/312,682

(22) PCT Filed: Apr. 26, 2002

(86) PCT No.: PCT/JP02/04237
§ 371 (c)(1),
(2), (4) Date: Dec. 30, 2002

(87) PCT Pub. No.: WO02/089980
PCT Pub. Date: Nov. 14, 2002

(65) Prior Publication Data
US 2003/0153459 A1 Aug. 14, 2003

(51) Int. Cl.$^7$ .................................................. B32B 3/12
(52) U.S. Cl. ...................... 428/118; 428/116; 428/34.4; 428/188; 428/220; 428/689; 428/698; 428/702; 422/180; 422/222; 55/523; 502/407; 502/414; 264/630; 264/631
(58) Field of Search ................................ 428/116, 118, 428/34.1, 34.4, 188, 220, 688, 689, 698, 702, 593; 422/168, 177, 180, 211, 222; 55/523; 502/407, 414; 264/628, 629, 630, 631

(56) References Cited

U.S. PATENT DOCUMENTS 6,649,244 B2 * 11/2003 Hamanaka et al. ......... 428/116

FOREIGN PATENT DOCUMENTS

| JP | A 2-86847 | 3/1990 |
|---|---|---|
| JP | A-02-207846 | 8/1990 |
| JP | A 10-174885 | 6/1998 |
| JP | A 11-277653 | 10/1999 |
| JP | A-2000-51710 | 2/2000 |
| JP | A 2000-225340 | 8/2000 |
| JP | A 2000-279729 | 10/2000 |

* cited by examiner

Primary Examiner—Deborah Jones
Assistant Examiner—Wendy Boss
(74) Attorney, Agent, or Firm—Oliff & Berridge, PLC (57) ABSTRACT

A honeycomb structure constituted by porous cell walls forming a cell group consisting of a plurality of cells, and a honeycomb outer wall surrounding and holding the outermost peripheral cells located at the circumference of the cells, a porosity is 5% to less than 30%, a basic wall thickness (Tc) of the cell walls is 0.030 mm$\leq T_c <$0.076 mm, an average surface roughness (Ra$_s$) of the outer wall is 0.5 $\mu$m$\leq$Ra$_s \leq$10 $\mu$m, and/or an average height (RzDIN$_s$) on the surface of the outer wall from a local maximum point to a next local minimum point is 5 $\mu$m$\leq$RzDIN$_s \leq$50 $\mu$m; and a process for producing such a honeycomb structure using a raw material having a specific average diameter. The honeycomb structure satisfies requirements of improved purification ability, erosion resistance and improved canning property at a good balance.

30 Claims, 5 Drawing Sheets

POROUS HONEYCOMB STRUCTURE AND PROCESS FOR PRODUCTION THEREOF

TECHNICAL FIELD

The present invention relates to a porous honeycomb structure and a process for production thereof. More particularly, the present invention relates to a honeycomb structure balanced in purification ability, end face durability and canning property, and suitably used, for example, in a carrier for a catalyst for purification of automobile exhaust gas, as well as to a process for production thereof.

BACKGROUND ART

Porous honeycomb structures are in wide use in a catalyst carrier (e.g. a carrier for catalyst for purification of automobile exhaust gas, a filter (e.g. a filter for diesel engine exhaust gas), etc. The regulation for exhaust gas is becoming stricter year by year in consideration of environmental problems; in order to respond to such a trend, catalysts for exhaust gas purification, when used for purification of the exhaust gas emitted from an automobile engine or the like, are required to have an improved purification ability. Meanwhile, a lower fuel consumption and a higher output are aimed strongly from the standpoint of engine development; in order to respond to such a situation, catalysts for exhaust gas purification are also required to have a lower pressure loss. Hence, in order to satisfy these requirements, there is a strong movement that by allowing a honeycomb structure to have a very small wall thickness; the gas permeability is enhanced to reduce the pressure loss and also, weight of the catalyst for exhaust gas purification is reduced to reduce the heat capacity, to improve the purification ability during warm-up.

Meanwhile, various foreign matter may come into the exhaust gas emitted from an engine, whereby a honeycomb structure may be subjected to scraping-off (erosion); therefore, improvement in erosion resistance is also required.

The above improvement in purification ability (e.g. lower heat capacity and lower pressure loss) and the above improvement in erosion resistance are generally contradictory to each other. For example, when a honeycomb structure is allowed to have an increased porosity and a smaller wall thickness in order to achieve a lower heat capacity, the honeycomb structure comes to have a lower strength and a lower erosion resistance.

In such applications, the honeycomb structure is used by being held by a metal-made can or the like and, in such use, the honeycomb structure need be held at certain strength so that there occurs no slippage between the honeycomb structure and the can. An improvement in canning property of the honeycomb structure, such as strength capable of withstanding the above strength or an ability to prevent slippage even at a low holding strength, is required.

For improvement of erosion resistance, there are described, in, for example, JP-A-2000-51710, a honeycomb structure in which cell walls are made thick only in the vicinities of the honeycomb structure end face, and a honeycomb structure in which the end face is made dense by coating the end face of a base honeycomb structure with a vitreous component such as glaze, water glass or the like, followed by firing. In the literature, there is a description that the porosity of the end face is 5 to 35%; however, there is disclosed only a honeycomb structure in which the porosity of other portion is 36%. Such a honeycomb structure is unable to satisfy all of low heat capacity, erosion resistance and canning property. Further, the literature makes no mention of a relation between porosity, wall thickness and surface roughness.

For improvement of canning property, there is disclosed, in JP-A-2-207846, a honeycomb structure in which the surface of outer wall is allowed to have unevenness by a method of applying a vibration in extrusion of the honeycomb structure. However, this method has a problem in that the wall is cut off in extrusion when the wall is thin; therefore, the method is difficult to apply to a honeycomb structure having a thin wall. Also, in JP-A-2-86847 is proposed a honeycomb structure in which the surface of outer wall is allowed to have an uneven part by applying sandblasting or spraying a ceramic material to the surface and the uneven surface is made more rough than another surface; and a process for production of such a honeycomb structure. This process, however, needs an additional step and is not economical. In these literatures as well, no mention is made on a relation between porosity, wall thickness and surface roughness, and no investigation is made on erosion resistance or heat capacity reduction.

DISCLOSURE OF THE INVENTION

The present invention has been made in view of the above-mentioned problems and aims at providing a honeycomb structure which satisfies requirements of improved purification ability, erosion resistance and improved canning property at a good balance and which is suitably used particularly in a carrier for catalyst for purification of automobile exhaust gas, etc.

The present invention further aims at a process for producing such a honeycomb structure, particularly a honeycomb structure of low porosity and good canning property.

In order to achieve the above aims, the present inventors made a study including various tests. As a result, the present inventors found out that while, in general, a high porosity and a thin cell wall are required in order to achieve a low heat capacity and the opposite is required in order to obtain improved erosion resistance, the influence of porosity on erosion resistance is greater when the wall is thinner. The present inventors also found out that in achieving a certain heat capacity, good erosion resistance is obtained by making thinner the wall and lower the porosity. The present inventors also found out that when the porosity is controlled at less than 30%, the canning property is reduced but this is caused by the smoothening of the surface of outer wall. The present inventors also found out that the canning property can be improved by allowing the average surface roughness ($Ra_s$) to fall in $0.5\ \mu m \leq Ra_s \leq 10\ \mu m$ and/or allowing the average height ($RzDIN_s$) on the surface of outer wall from a local maximum point to a next local minimum point to fall in $5\ \mu m \leq RzDIN_s \leq 50\ \mu m$, and further that the above $Ra_s$ and $RzDIN_s$ can be achieved by allowing the pores having pore diameters of 1 μm or more to be 90% by volume or more of the total pore volume. The first aspect of the present invention is based on the above findings.

The first aspect of the present invention provides a honeycomb structure constituted by porous cell walls which form a cell group consisting of a plurality of cells adjacent to each other, and a honeycomb outer wall that surrounds and holds the outermost peripheral cells located at a circumference of the cell group, characterized in that a porosity is 5% to less than 30%, a basic wall thickness ($T_c$) of the cell walls is 0.030 mm≦$T_c$<0.076 mm, an average surface roughness ($Ra_s$) of the outer wall is 0.5 $\mu$m≦$Ra_s$≦10 $\mu$m, and/or an average height ($RzDIN_s$) on the surface of the outer wall from a local maximum point to a next local minimum point is 5 $\mu$m≦$RzDIN_s$≦50 $\mu$m.

In the first aspect of the present invention, a preferred example is a honeycomb structure having the following characteristics. That is, in the first aspect of the present invention, it is preferred for improved canning property that $Ra_s$ is 0.5 $\mu$m≦$Ra_s$≦10 $\mu$m and $RzDIN_s$ is 5 $\mu$m≦$RzDIN_s$≦50 $\mu$m and, preferably, $Ra_s$ is 1.0 $\mu$m≦$Ra_s$≦10 $\mu$m and $RzDIN_s$ is 10 $\mu$m≦$RzDIN_s$≦50 $\mu$m, and an open frontal area (P) of honeycomb structure, of 83% or more is preferred for lower heat capacity, lower pressure loss and improved purification ability. Further, an outer wall thickness of 0.076 mm or more is preferred for improved canning property. Also, it is preferred that the average surface pore diameter of outer wall is larger than an average inside pore diameter of outer wall, in order to make $Ra_s$ and $RzDIN_s$ large. It is also preferred for higher loading power for catalyst that the average surface roughness ($Ra_c$) of the cell wall is 0.5 $\mu$m or more and/or the average height ($RzDIN_c$) on the surface of the cell wall from a local maximum point to a next local minimum point is 5 $\mu$m or more. It is further preferred that in the honeycomb structure, the pores having pore diameters of 1 $\mu$m or more is 90% or more of the total pore volume, in order to make large Ra and RzDIN.

In order to obtain improved erosion resistance, improved isostatic strength and improved canning property, it is preferred that there is a relation of 1.10≦$(Tr_1 \sim Tr_{5\text{-}20})/T_c$≦3.00, preferably, 1.10≦$(Tr_1 \sim Tr_{5\text{-}20})/T_c$≦2.50, more preferably 1.20≦$(Tr_1 \sim Tr_{5\text{-}20})/T_c$≦1.60 between the basic cell wall thickness ($T_c$) and each cell wall thickness ($Tr_1 \sim Tr_{5\text{-}20}$) of cells existing between the outermost peripheral cell taken as a first cell and also as a first starting cell and a first end cell which is any cell of a fifth cell to a twentieth cell, preferably a fifth cell to a fifteenth cell, all extending inwardly from the first starting cell. In that case, it is preferred that, taking a first cell inward from and adjacent to the first end cell as a second starting cell, cells existing between the second starting cell and a second end cell, which is any cell of a third cell to a fifth cell all extending inwardly from the second starting cell, have such a cell wall thickness that is substantially uniform, inverse trapezoid or spool-shaped in each cell and gets thinner one by one inwardly and that the thinnest cell wall thickness is identical to the basic cell wall thickness ($T_c$).

It is also preferred that there is a relation of 1.10≦$Tr_1/T_c$≦3.00 between the cell wall thickness ($Tr_1$) of outermost peripheral cell and the basic cell wall thickness ($T_c$), taking outermost peripheral cell as a third starting cell, there is a relation of 1.10≦$(Tr_1 \sim Tr_{5\text{-}20})/T_c$≦3.00, preferably 1.10≦$(Tr_1 \sim Tr_{5\text{-}20})/T_c$≦2.50, more preferably 1.20≦$(Tr_1 \sim Tr_{5\text{-}20})/T_c$≦1.60 between the basic cell wall thickness ($T_c$) and each cell wall thickness ($Tr_1 \sim Tr_{5\text{-}20}$) of cells existing between the third starting cell and a third end cell which is any cell of a fifth cell to a twentieth cell all extending inwardly from the third starting cell, the cells have a cell wall sectional shape of inverse trapezoid or spool or have a uniform cell wall thickness and their cell wall thicknesses get smaller as the cell is more inward, and the smallest cell wall thickness is identical to the basic cell wall thickness ($T_c$).

When the honeycomb structure has a sectional area of 160 cm$^2$ or more, it is preferred that there is a relation of 1.10≦$(Tr_1 \sim Tr_{10\text{-}40})/T_c$≦3.00, preferably 1.10≦$(Tr_1 \sim Tr_{10\text{-}40})/T_c$≦2.50, more preferably 1.20≦$(Tr_1 \sim Tr_{10\text{-}40})/T_c$≦1.60 between the basic cell wall thickness ($T_c$) and each cell wall thickness ($Tr_1 \sim Tr_{10\text{-}40}$) of cells existing between the outermost peripheral cell taken as a first cell and also as a first starting cell and a first end cell which is any cell of a tenth cell to a fortieth cell all extending inwardly from the first starting cell.

It is further preferred for improvement of erosion resistance of honeycomb structure end face that the value of porosity (%) of part or all of the cell wall portions within 30 mm from one or both end faces of the honeycomb structure is lower by at least 5 than the value of porosity (%) of other cell wall portion. It is also preferred for balancing of erosion resistance and low heat capacity that the length of the cell wall portions having a lower porosity, from the honeycomb structure end face is not uniform. It is also preferred for improved erosion resistance that the thickness of the cell walls at one or both end faces of the honeycomb structure is larger than the thickness of cell walls at other portion.

Thus, by making large the thickness of the cell wall near the circumference of the honeycomb structure and/or making strong the end face, the basic wall thickness ($T_c$) can be made even smaller. $T_c$≦0.056 mm is preferred for lower heat capacity.

Further, the honeycomb structure of the present invention preferably has a B axis flexural strength of 0.8 MPa or more and is preferably made of at least one kind of material selected from the group consisting of cordierite, alumina, mullite, silicon nitride, aluminum titanate, zirconia and silicon carbide. The honeycomb structure of the present invention preferably has a sectional shape of circle, elliptic, oval, trapezoid, triangular, tetragonal, hexagonal or asymmetry between the right and the left, and its cell sectional shape is preferably triangular or hexagonal. It is also preferred that the present honeycomb structure is formed so that an intersection between cell walls has a radius of curvature of 1.2 mm or less. It is also preferred that an intersection between cell wall and a honeycomb outer wall has a radius of curvature of 1.2 mm or less.

The honeycomb structure of the present invention is preferably used as a carrier for catalyst for purification of automobile exhaust gas. It is also preferred that a catalyst component is loaded on the cell walls of the honeycomb structure, which is assembled into a catalytic converter, and held the outer wall at the outer surface.

The present inventors investigated on the process for producing a honeycomb structure having the above-mentioned properties. As a result, the present inventors found out that by using, as a raw material, a combination of talc and kaolin both having particular particle diameters, a honeycomb structure having a rough surface and a low porosity can be produced economically.

The second aspect of the present invention provides a process for producing a honeycomb structure constituted by porous cell walls which form a cell group consisting of a plurality of cells adjacent to each other, and a honeycomb outer wall which surrounds and holds the outermost peripheral cells located at a circumference of the cell group, in which honeycomb structure a porosity is 5% to less than 30%, a basic wall thickness (Tc) of the cell walls is 0.030 mm≦Tc<0.076 mm, an average surface roughness ($Ra_s$) of the outer wall is 0.5 $\mu$m≦$Ra_s$≦10 $\mu$m, and/or an average height ($RzDIN_s$) on the surface of the outer wall from a local maximum point to a next local minimum point is 5 $\mu$m≦$RzDIN_s$≦50 $\mu$m, the process being characterized in that production is conducted using a raw material containing at least a talc component and a kaolin component, the talc component containing coarse particle talc having an average particle diameter of 7 μm or more and fine particle talc having an average particle diameter of ⅔ or less of that of the coarse particle talc, the kaolin component containing coarse particle kaolin having an average particle diameter of 7 μm or more and fine particle kaolin having an average particle diameter of ⅔ or less of that of the coarse particle kaolin.

In the second aspect as well, a preferred honeycomb structure is a honeycomb structure having preferable characteristics mentioned in the first aspect.

BRIEF DESCRIPTION OF THE DRAWINGS

FIGS. 1(a) to (c) are drawings schematically showing an example of the honeycomb structure of the present invention.

FIGS. 3(a) to (c) are each a drawing showing the sectional view of cell walls of an embodiment of the honeycomb structure of the present invention.

BEST MODE FOR CARRYING OUT THE INVENTION

The present invention is described below referring to preferred embodiments of the present invention. However, the present invention is not restricted to the following embodiments.

Figure 1A:
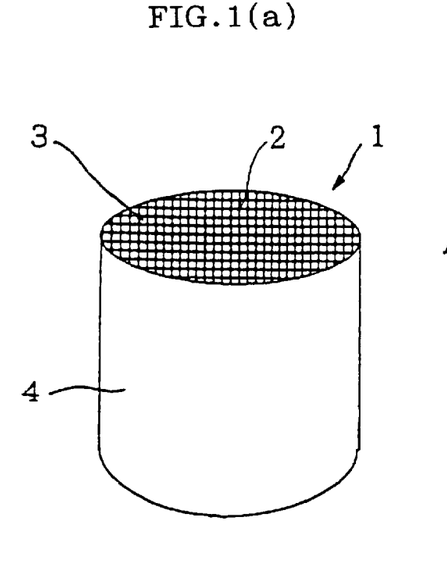
FIG. 1(a) is a perspective view.
Figure 1B:
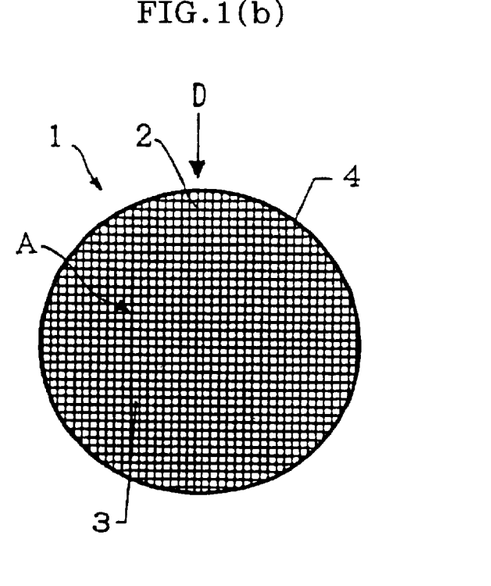
FIG. 1(b) is a plan view.
Figure 1C:
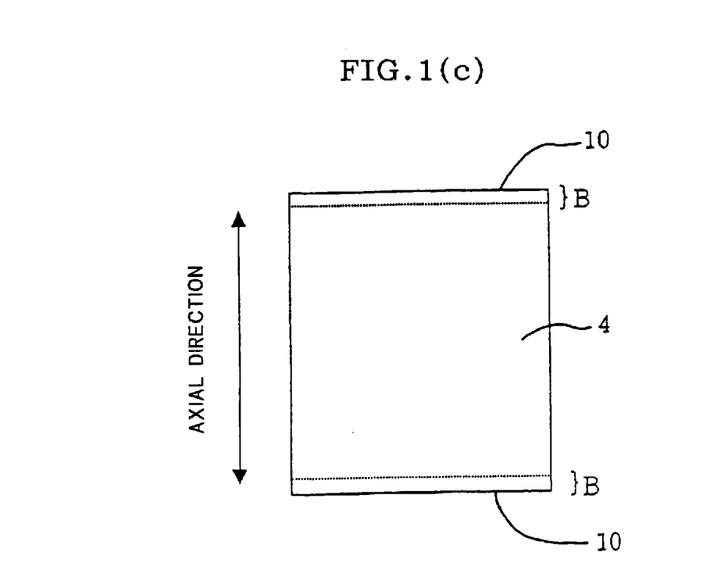
FIG. 1(c) is a side view.

As shown in FIGS. 1(a), (b) and (c), a honeycomb structure 1 of the present invention are constituted by porous cell walls 2 which form a plurality of cells 3 adjacent to each other and extending in the axial direction, and a porous honeycomb outer wall 4. Incidentally, in the present invention, "section" refers to a section perpendicular to the axial direction unless otherwise specified.

The characteristics of the present invention lie in satisfying all of the following three requirements; that is, the porosity of the total of the cell walls 2 and the outer wall 4 both constituting the honeycomb structure 1 is 5% to less than 30%, the thickness ($T_c$) of the cell walls 3 is 0.030 mm$\leq T_c <$0.076 mm and the average surface roughness ($Ra_s$) of the outer wall 4 is 0.5 μm$\leq Ra_s \leq$10 μm, and/or the average height ($RzDIN_s$) on the surface of the outer wall 4 from a local maximum point to a next local minimum point is 5 μm$\leq RzDIN_s \leq$50 μm. By controlling the porosity at 5% to less than 30% and $T_c$ at 0.030 mm$\leq T_c <$0.076 mm, a lower heat capacity and improved erosion resistance can be achieved. In this case, a porosity of less than 30% results in too smooth a wall surface and reduced caning property; however, by controlling $Ra_s$ at 0.5 μm$\leq Ra_s \leq$10 μm and/or $RzDIN_s$ at 5 μm$\leq RzDIN_s \leq$50 μm, good canning property is obtainable. A porosity of less than 5% results in too high a heat capacity and a porosity of 30% or more results in too large an erosion amount. A $T_c$ of 0.076 mm or more results in too high a heat capacity and a $T_c$ of less than 0.03 mm results in insufficient wall strength and too large an erosion amount. Even with a porosity of 30% or more and a $T_c$ of less than 0.076 mm, a heat capacity of about the same level as in the present invention can be obtained but too large an erosion amount results. A $Ra_s$ of less than 0.5 μm and a $RzDIN_s$ of less than 5 μm result in too low canning property. A $Ra_s$ of more than 10 μm and a $RzDIN_s$ of more than 50 μm result in too large a surface unevenness, too large a variation in diameter, and too many pores in a honeycomb structure (this leads to a reduced strength and easy breakage). In the present invention, it is preferred to satisfy both of 0.5 μm$\leq Ra_s \leq$10 μm and 5 μm$\leq RzDIN_s \leq$50 μm, more preferably both of 1.0 μm$\leq Ra_s \leq$10 μm and 10 μm$\leq RzDIN_s \leq$50 μm.

In the present invention, "porosity" is a percentage of the volume of pores in a porous material constituting cell walls 2 and an outer wall 4, to the total volume of the porous material. "Basic wall thickness ($T_c$)" refers to the smallest wall thickness of the cell walls of a honeycomb structure 1. In the present invention, the wall thicknesses are preferably uniform in the whole portion of honeycomb structure; however, when the thickness of cell walls near the circumference of honeycomb structure is made large, it is preferred that the thickness of cell walls of other inside portion is made uniform. In this case, the wall thickness of the other inside portion is the basic wall thickness ($T_c$). When the thickness of cells in the vicinity of the end face 10 of honeycomb structure is made large, it is preferred that the thickness of cell walls of other portion is made uniform. In that case, the thickness of walls excluding the walls in the vicinity of the end face 10 is the basic wall thickness ($T_c$). "Average surface roughness (Ra)" is calculated as an average of displacements from an average line based on the results obtained by measurements under the conditions mentioned in Examples shown later. "RzDIN" is calculated as an average of differences between the height of any mountain top (which is a local maximum) and the height of the next valley bottom (which is a minimum), in a range of the measurement made under the same conditions as above. Here, $Ra_s$ and $RzDIN_s$ refer to the Ra and RzDIN of outer wall 4, respectively; and $Ra_c$ and $RzDIN_c$ refer to the Ra and RzDIN of cell walls 2, respectively.

In the present invention, in order to make large $Ra_s$ and $RzDIN_s$, it is preferred that the average surface pore diameter of outer wall 4 is larger than the average inside pore diameter of outer wall 4. Here, "average surface pore diameter" refers to an average diameter of open pores present at the surface of outer wall 4, and "average inside pore diameter" refers to an average diameter of closed pores present inside the outer wall 4. In the outer wall 4, the average surface pore diameter can be make larger than the average inside pore diameter by making large the proportion of large-diameter pores, preferably by making pores of 1 μm or more in diameter at least 90% of the total pores in the outer wall 4.

In the present invention, while a porosity of less than 30% tends to make the surface of cell wall 2 smooth, it is preferred that the average surface roughness ($Ra_c$) of cell wall and/or the ($RzDIN_c$) are controlled at 0.5 μm$\leq Ra_c \leq$10 μm and/or 5 μm$\leq RzDIN_c \leq$50 μm, preferably at 1.0 μm$\leq Ra_c \leq$10 μm and/or 10 μm$\leq RzDIN_c \leq$50 μm. Thereby, the loading power for catalyst is increased and the detachment of catalyst is prevented.

In order to thus control the porosity at 5% to less than 30%, $Ra_s$ at 0.5 μm$\leq Ra_s \leq$10 μm, preferably at 1.0 μm$\leq Ra_s \leq$10 μm and/or $RzDIN_s$ at 5 μm$\leq RzDIN_s \leq$50 μm, preferably at 10 μm$\leq RzDIN_s \leq$50 μm, and/or the average surface roughness ($Ra_c$) of cell wall 2 at 0.5 $\mu m \leq Ra_c \leq 10$ $\mu m$ and/or $RzDIN_s$ at 5 $\mu m \leq RzDIN_c \leq 50$ $\mu m$, it is preferred that in the cell walls 2 and outer wall 4 constituting the honeycomb structure of the present invention, the pores having diameters of 1 $\mu m$ or more are 90% by volume or more of the total pore volume. By allowing the pores to have such a constitution, fine surface unevenness can be obtained and Ra and RzDIN levels such as mentioned above can be achieved.

In the present invention, when the open frontal area of honeycomb structure is 83% or more, a low pressure loss and a low heat capacity can be realized, and resultantly the honeycomb structure of the present invention can have improved purification ability. Here, "open frontal area" refers to a percentage of the area of the cells, i.e. the holes surrounded by walls at the end face, to the area of end face 10 of honeycomb structure. The open frontal area can be increased by reducing the cell density and/or the thickness of cell wall. Also, a thickness of outer wall 4 of 0.076 mm or more is preferred because it can increase the strength of carrier during canning.

Figure 2:
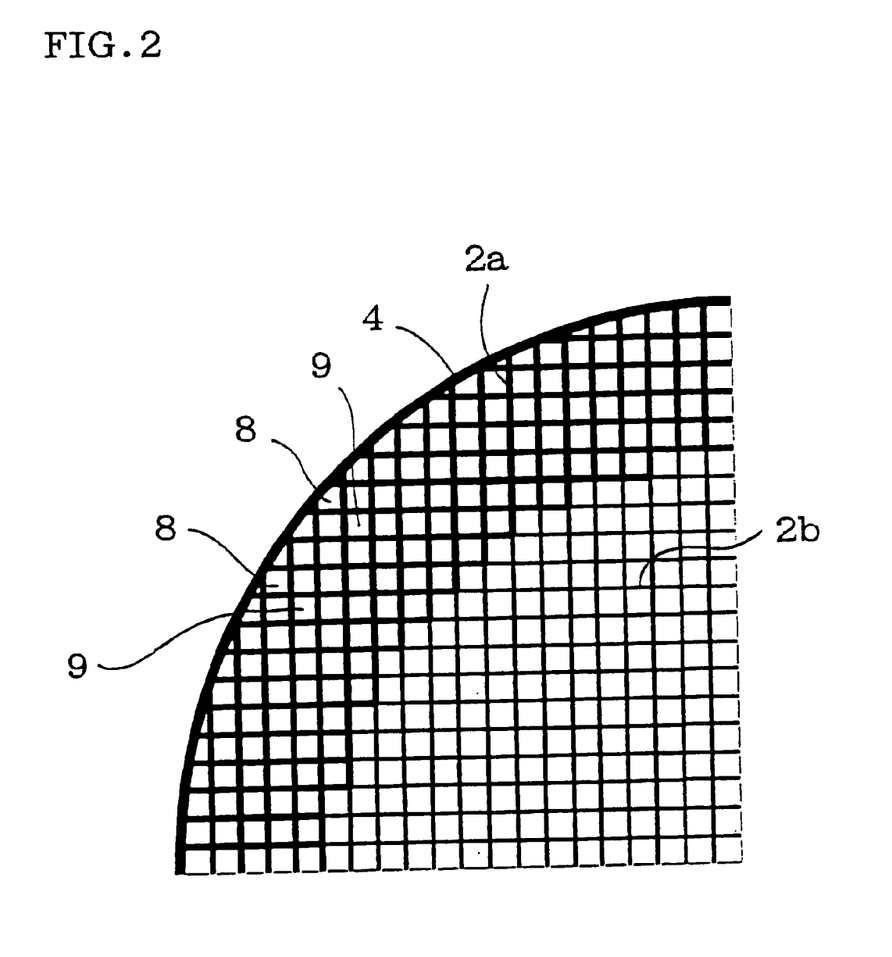
FIG. 2 is a partially enlarged view schematically showing an embodiment of the present honeycomb structure in which the cell walls near the outer wall are made thick.

In the present invention, it is also preferred for improved erosion resistance that as shown in FIG. 2, the cell walls 2a near the circumference of honeycomb structure are made thick. By making the cell walls 2 near the circumference thick, it is also possible to obtain an improvement in isostatic strength, an increase in holding power in canning and resultantly improved canning property. Here, "isostatic strength" is a strength (expressed by an applied pressure when breakage occurs) obtained by a test conducted based on an automobile standard JASO M 505-87. In FIG. 2, there are outermost peripheral cells 8 closest to the outer wall 4, and second cells 9 extend inwardly from the outermost peripheral cells 8. The wall thickness of the outermost peripheral cells is indicated by $Tr_1$ and the wall thickness of the second cell is indicated by $Tr_2$. Any cell (not shown in FIG. 2) of fifth to fifteenth cells is indicated by $Tr_{5\text{-}15}$. Incidentally, cell walls 2 are largely divided into cell walls 2a near the circumference of honeycomb structure and basic cell walls 2b.

In the honeycomb structure of the present invention, it is preferred that there is a relation of $$1.10 \leq (Tr_1 \sim Tr_{5\text{-}15})/T_c \leq 3.00$$

between the basic cell wall thickness ($T_c$) and each cell wall thickness ($Tr_1 \sim Tr_{5\text{-}15}$) of cells existing between an outermost peripheral cell taken as a starting cell and a end cell which is any cell within a fifth cell to a fifteenth cell all extending inwardly from the starting cell. When this value $[(Tr_1 \sim Tr_{5\text{-}15})/T_c]$ is less than 1.10, it does not contribute to improve erosion resistance and isostatic strength and therefore it does not contribute to improve canning property. When the value is more than 3.0, heat capacity and pressure loss are increased. Further, when the wall thicknesses ($Tr_1 \sim Tr_4$) of first to only fourth cells are made large at a particular proportion, there is no improvement in erosion resistance or isostatic strength; when even the wall thicknesses of cells from first to over than fifteenth cell, particularly to over than twentieth cell are made large at a particular proportion, pressure loss and carrier mass are increased by more than required, resultantly heat capacity is increased; therefore, enlargement of wall thicknesses of these cells is not preferred.

Figure 3A:
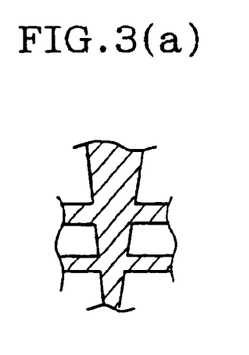
FIG. 3(a) shows an inversely trapezoidal cell wall.
Figure 3B:
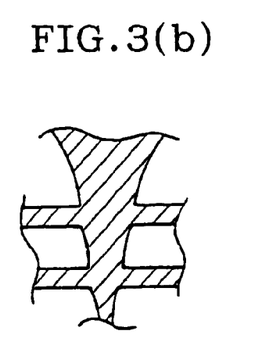
FIG. 3(b) shows a spool-shaped cell wall.
Figure 3C:
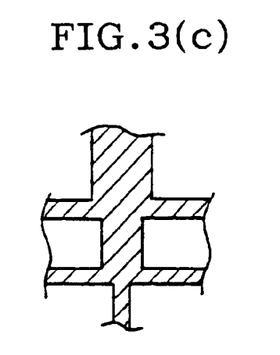
FIG. 3(c) shows a rectangular cell wall.

In the ceramic-made honeycomb structure of the present invention, it is preferred that as shown in FIG. 3, cells existing between a first cell inward from and adjacent to the first end cell, taken as a second starting cell and a second end cell which is any cell of a third cell to a fifth cell all extending inwardly from the second starting cell have a cell wall sectional shape of inverse trapezoid [FIG. 3(a)], spool [FIG. 3(b)] or rectangle (each cell has a uniform wall thickness) [FIG. 3(c)] with the thickness of cell wall being smaller as the cell is more inward (the proportion at which the thickness is made smaller, may be 1.10~3.00) and that the smallest cell wall thickness is identical to the basic cell wall thickness ($T_c$). By employing such a constitution, an improvement in erosion resistance can be attained while increases in heat capacity and pressure loss are prevented.

It is also preferred in the present invention that there is a relation of $1.10 \leq Tr_1/T_c \leq 3.00$ between the cell wall thickness ($Tr_1$) of the outermost peripheral cell and the basic cell wall thickness ($T_c$), there is a relation of $1.10 \leq (Tr_1 \sim Tr_{5\text{-}20})/T_c \leq 3.00$ between the basic cell wall thickness ($T_c$) and each cell wall thickness ($Tr_1 \sim Tr_{5\text{-}20}$) of cells existing between the outermost peripheral cell taken as a first cell and also as a third starting cell and a third end cell which is any cell of a fifth cell to a twentieth cell all extending inwardly from the third starting cell, the cells have a cell wall sectional shape of inverse trapezoid, spool or rectangle and their cell wall thicknesses get smaller as the cell is more inward, and the smallest cell wall thickness is identical to the basic cell wall thickness ($T_c$). By employing such a constitution, improvements in pressure loss and thermal shock resistance can be attained.

In the present invention, it is also preferred for practical application when heat capacity and pressure loss are taken into consideration that the relation between each cell wall thickness ($Tr_1 \sim Tr_{5\text{-}20}$) and the basic cell wall thickness (Tc) is more restricted so as to be $1.10 \leq (Tr_1 \sim Tr_{5\text{-}20})/T_c \leq 2.50$, particularly $1.20 \leq (Tr_1 \sim Tr_{5\text{-}20})/T_c \leq 1.60$.

In recent years, mounting of honeycomb carrier even on large vehicles such as truck and the like has increased and use of a large-sized honeycomb carrier has become necessary. In a large-sized honeycomb carrier (in which, when the sectional shape of honeycomb outer wall is circular, the diameter is about 144 mm or more, that is, the sectional area is about 160 $cm^2$ or more), it is preferred that the first end cell counted from the outermost peripheral cell (1st starting cell) is stretched to any of the 10th to 40th cells, preferably the 10th to 30th cells, all extending inwardly from the outermost peripheral cell, that is, the cells of thickened wall are increased and that the ratio of the cell wall thickness ($Tr_1 \sim Tr_{10\text{-}40}$), preferably ($Tr_1 \sim Tr_{10\text{-}30}$) to the basic cell wall thickness (Tc), i.e. ($Tr_1 \sim Tr_{10\text{-}40}$)/Tc, preferably ($Tr_1 \sim Tr_{10\text{-}30}$)/Tc is set ordinarily at 1.10 to 3.00 and, in practical application, at 1.10 to 2.50, preferably 1.20 to 1.60.

In the present invention, it is preferred for further improvement of erosion resistance that the value of porosity of all or part of the cell walls 2 within 30 mm from each end face 10 of honeycomb structure, i.e. the cell walls 2 in a zone B is made lower by at least 5 than the value of porosity of the cell walls of other portion. This implies that when the porosity of ordinary cell walls 2 (cell walls other than those of zone B) is, for example, 28%, the porosity of part or all of the cell walls 2 in the zone B is 23% or less. In this case, the length from each end face 10 where the porosity is made low, may be uniform; however, it is preferred that each cell wall 2 may take any desired (nonuniform) length of 0 to 30 mm. By employing a nonuniform length, the stress concentration at the border where porosity changes can be relaxed.

It is also preferred for further improvement of erosion resistance that the thickness of all or part of the cell walls 2 in the zone B is made larger than the thickness of the cell walls 2 of other portion. In this case as well, it is preferred that each cell wall 2 in the portion of larger wall thickness takes any desired (nonuniform) length of 0 to 30 mm, for the same relaxation of stress concentration as mentioned above.

The above-mentioned adoption of thicker cell walls near the circumference of honeycomb structure 1, lower porosity in cell walls near the end face 10, and thick outer wall is effective particularly when the thickness of cell walls is small. In this case, the cell wall thickness $T_c$ is preferably $T_c \leq 0.056$ μm.

It is also preferred that the B axis strength of honeycomb structure is controlled at 0.8 MPa or more, because such a B axis strength can reduce the breakage which occurs when the foreign matter in exhaust gas collides with cell walls and thereby an improvement in erosion resistance is attained. Here, the B axis strength is specified by JASO M 505-87 and refers to a strength measured for a sample obtained by cutting a honeycomb structure in a direction perpendicular to the axial direction and also in a direction along cell walls.

As the cell walls and honeycomb outer wall used in the present invention, there can be mentioned, for example, those made of at least one kind of material selected from the group consisting of cordierite, alumina, mullite, silicon nitride, aluminum titanate, zirconia and silicon carbide.

As the sectional shape of the honeycomb structure of the present invention, there can be mentioned, for example, a circle, an ellipse, an oval, a trapezoid, a triangular, a tetragonal, a hexagonal or an asymmetry between the right and the left. Of these, a circle, an ellipse or an oval is preferred.

As to the sectional shape of cell used in the present invention, there is no particular restriction. There can be mentioned, for example, a triangular or higher polygons, for example, a square, a rectangle and a hexagonal. Of these, a triangular, a tetragonal or a hexagonal is preferred.

Figure 4:
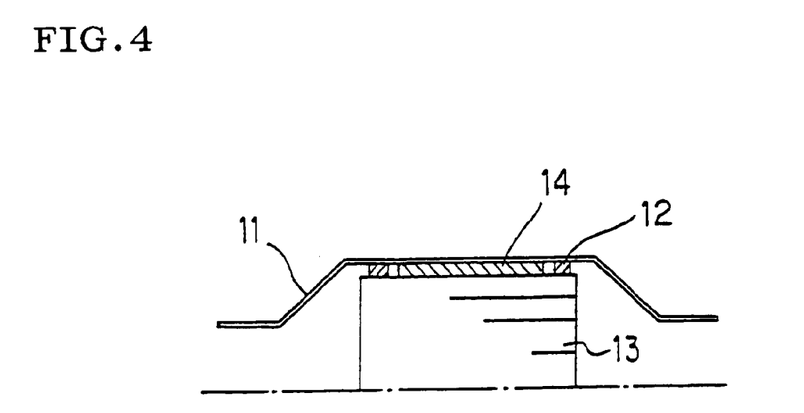
FIG. 4 is a drawing schematically showing a state in which the honeycomb structure of the present invention has been placed in a converter case.

As to the application of the honeycomb structure of the present invention, there is no particular restriction; and the present honeycomb structure can be used in various applications such as various filters, catalyst carrier and the like. The present honeycomb structure is preferably used particularly in a carrier for purification of automobile exhaust gas. Also, the present honeycomb structure is preferably used by being accommodated in a catalytic converter case as shown in FIG. 4. In FIG. 4, a honeycomb structure 13 is accommodated in a converter case 11 by being held by a ring 12 at the outer surface. There is no particular restriction as to the ring 12, but a metallic mesh-made ring is used ordinarily. Between the converter case 11 and the outer surface of the honeycomb structure 13, a holding member 14 such as mat, cloth or the like is interposed preferably.

It is also possible to apply padding to the area where outermost peripheral cell wall come into contact with the outer wall of honeycomb structure (this padding is contact padding) or to the internal portion of the outer wall on at least the area where cell walls adjacent each other come into contact with the outer wall with making the space narrower (this padding is V-shaped padding), and thereby achieve a rib shape of higher accuracy, an improved isostatic strength, etc. and make the cell wall thickness relatively thin. Specifically, the corners of each cell are formed so as to have a radius of curvature of preferably 1.2 mm or less and the intersection between cell wall and honeycomb outer wall is formed so as to have a radius of curvature of preferably 1.2 mm or less.

Next, description is made on the process for producing the honeycomb structure of the present invention.

For example, a honeycomb structure made of a cordierite can be produced, for example, by a series of steps which comprise adding 15 to 25% by weight of graphite and 5 to 15% by weight of a synthetic resin such as PET, PMMA, cross-linked polystyrene, phenolic resin or the like as a pore-making agent, to a raw material for cordierite obtained by mixing, at predetermined proportions, talc, kaolin, calcinated kaolin, alumina, aluminum hydroxide and silica so as to give a chemical composition of $SiO_2$ (42 to 56% by weight), $Al_2O_3$ (30 to 45% by weight) and $MgO$ (12 to 16% by weight), adding required amounts of a type of methyl cellulose and a surfactant, adding water appropriately, kneading them to obtain a puddle, subjecting the puddle to vacuum deaeration and then to extrusion into a honeycomb structure, drying the honeycomb structure by dielectric drying, microwave drying or hot air drying, and firing the resulting honeycomb structure at the highest temperature of 1,400 to 1,435° C.

In order to obtain a porosity of 30% or less, there are generally used a talc of small average particle diameter, specifically a talc having an average particle diameter of 7 μm or less and a kaolin having an average particle diameter of ⅓ or less of that of the talc. However, the characteristics of the second aspect are such that there are used, as a raw material, a combination of a coarse particle talc having an average particle diameter of 7 μm or more and a fine particle talc having an average particle diameter of ⅔ or less of that of the coarse particle talc and a combination of a coarse particle kaolin having an average particle diameter of 7 μm or more and a fine particle kaolin having an average particle diameter of ⅔ or less of that of the coarse particle kaolin. By using such combinations, there can be easily produced a honeycomb structure having a porosity and outer wall surface roughnesses ($Ra_s$ and $RzDIN_s$) all falling in the scope of the first invention. The preferable proportions of the coarse particle talc and the fine particle talc are 10/90~60/40, and the preferable proportions of the coarse particle kaolin and the fine particle kaolin are 10/90~60/40. Further, in order to produce a honeycomb structure of low porosity and high surface roughness, it is preferred to conduct molding using a kneader enabling strong kneading and dense packing of raw materials, for example, a Banbury kneader, a pressure kneader, a continuous molding machine or the like. Incidentally, "average particle diameter" refers to a weight-average particle diameter obtained by measuring a particle size distribution using LA-910 (laser diffraction type) produced by HORIBA, Ltd.

EXAMPLES

Next, the present invention is described below more specifically by way of Examples. However, the present invention is in no way restricted by these Examples. Incidentally, in the following Examples, % in compounding ratio refers to % by weight unless otherwise specified. Production of honeycomb structures Examples 1 to 4

100% of raw materials shown in Table 1 were mixed with 8% of hydroxypropyl methyl cellulose, 0.5% of potassium laurate soap, 2% of a polyether and 28% of water (8%, 0.5%, 2% and 28% were all based on 100% of the raw materials); the mixture was fed into a continuous molding machine to form a honeycomb structure having a cell wall thickness of 0.055 mm and a cell density of 900 cells/in.² (140 cells/cm²). The honeycomb structure was cut into a predetermined dimension and the resulting material was kept at the maximum temperature of 1,430° C. for 4 hours for sintering.

Comparative Examples 1 and 2

100% of raw materials shown in Table 1 were kneaded with 4% of methyl cellulose, 0.7% of sodium stearate and 28% of water (4%, 0.7% and 28% were all based on 100% of the raw materials) using an open type sigma kneader to obtain a puddle. The puddle was converted into a cylindrical puddle using a vacuum pug mill. The cylindrical puddle was fed into an extruder to form a honeycomb structure having a cell wall thickness of 55 μm and a cell density of 900 cells/in.$^2$ (140 cells/cm$^2$). The honeycomb structure was cut into a predetermined dimension and the resulting material was kept at the maximum temperature of 1,430° C. for 4 hours for sintering.

The honeycomb structures obtained in Examples 1 to 4 and Comparative Examples 1 and 2 were measured for porosity, average pore diameter, average surface roughness (Ra$_s$) of outer wall and RzDIN$_s$ according to the following methods.

Measurement of Porosity
Tester: Porosimeter (Autopore 9220 Produced by Micromeritics Co.)
Test Procedure
(1) A sample of 0.1 g or more was cut out from a honeycomb structure.
(2) The sample was dried at 150° C. for 2 hours and placed in a container. The container was set in a tester.
(3) Mercury was injected into the container. A pressure corresponding to a predetermined pore diameter was applied. The volume of mercury absorbed by the sample was measured.
(4) Pore distribution was calculated from the applied pressure and the volume of mercury absorbed.
(5) Pore volume was calculated from the volume of mercury absorbed by applying a pressure of 68.6 MPa (700 kgf/cm$^2$).
(6) Porosity was determined from a total pore volume using the following formula.

Porosity %=total pore volume (per g)×100/[total pore volume (per g)+1/2.52]

Measurement of Surface Roughness
Specification: ISO 42871/1
Tester: a surface roughness and shape tester, Form Talisurf S4C, produced by Taylor Hobson Co.
Feeler end radius: 2 μm
Measurement speed: 1 mm/sec
Measurement direction: 90° relative to the lengthwise direction of cell wall surface [a direction indicated by D in FIG. 1(b)].
Measurement length: about 25 mm
Measurement points: measurement was made at arbitrary 5 points each twice and an average thereof was taken as a measurement data.

Results are shown in Table 1. The honeycomb structure obtained in Comparative Example 1 was large in surface roughness Ra$_s$ and RzDIN$_s$ but was more than 30% in porosity. The honeycomb structure obtained in Comparative Example 2 was less than 30% in porosity but was small in Ra$_s$ and RzDIN$_s$. The honeycomb structures obtained in Examples 1 to 4 were in the scope of the honeycomb structure of the present invention in porosity, Ra$_s$ and RzDIN$_s$. From these results, it was clear that by using the production process of the present invention, there can be easily produced a honeycomb structure having a porosity of 5% to less than 30%, Ra$_s$ of 0.5 μm≦Ra$_s$≦5 μm and RzDIN$_s$ of 5 μm≦RzDIN$_s$≦50 μm.

TABLE 1

| Test No. | compounding ratio(wt %) | | | | | | | particle diameter ratio | | properties of fired body | | | | | |
|---|---|---|---|---|---|---|---|---|---|---|---|---|---|---|---|
| | Talc A (average particle diameter μm) | Talc B (average particle diameter μm) | Kaolin A (average particle diameter μm) | Kaolin B (average particle diameter μm) | Alumina (average particle diameter μm) | Aluminum Hydroxide (average particle diameter μm) | Silica (average particle diameter μm) | Talc A/ Talc B | Kaolin A/ Kaolin B | Thermal expansion coefficient of A axis (×10$^{-6}$/° C.) | Thermal expansion coefficient of B axis (×10$^{-6}$/° C.) | Porosity (%) | Average pore diameter (μm) | Surface roughness of outer wall (μm) Ra | Surface roughness of outer wall (μm) RzDIN |
| Ex. 1 | 20 (12) | 21 (8)(10) | 10 (3) | 32 (5) | 10 (2) | 7 — | | 1/0.67 | 1/0.3 | 0.51 | 0.82 | 30 | 4.1 | 1.9 | 13.6 |
| Ex. 2 | 5 (11) | 35 (7) | 5 (15) | 32 (10) | 8 (5) | 13 (2) | 2 (4) | 1/0.67 | 1/0.64 | 0.54 | 0.85 | 28 | 3.6 | 1.7 | 12.1 |
| Ex. 3 | 20 (7) | 20 (4) | 20 (7) | 17 (2.5) | 8 (3) | 13 (1.5) | 2 (2) | 1/0.57 | 1/0.43 | 0.36 | 0.67 | 22 | 2.7 | 1.3 | 9.3 |
| Ex. 4 | (20) | 10 (4) | 30 (7) | 12 (2.5) | 10 (3) | 16 (1.5) | 12 (2) | 10 1/0.2 | 1/0.43 | 0.81 | 1.12 | 26 | 8.6 | 1.5 | 10.5 |
| Comp. 1 | 40 (8) | — | 20 (6) | 17 (6) | 8 (5) | 13 (2) | 2 (4) | — | 1/1 | 0.68 | 1.01 | 31 | 4.3 | 1.9 | 13.2 |
| Comp. 2 | 41 (4.5) | — | 20.5 (1) | 25 (0.4) | 13.5 (4) | — | — | — | 1/0.4 | 0.63 | 0.82 | 27 | 1.8 | 0.4 | 4.0 |

Examples 5 and 6 and Comparative Examples 3 and 4

Honeycomb structures of Examples 5 and 6 and Comparative Examples 3 and 4 having a cell density of 900 cells/in.$^2$ (140 cells/cm$^2$) and a cell wall thickness and a porosity both shown in Table 2 were produced by the same production process as in Examples 1 to 4, and were evaluated for erosion resistance by the following method.

Evaluation of Erosion Resistance

Figure 5:
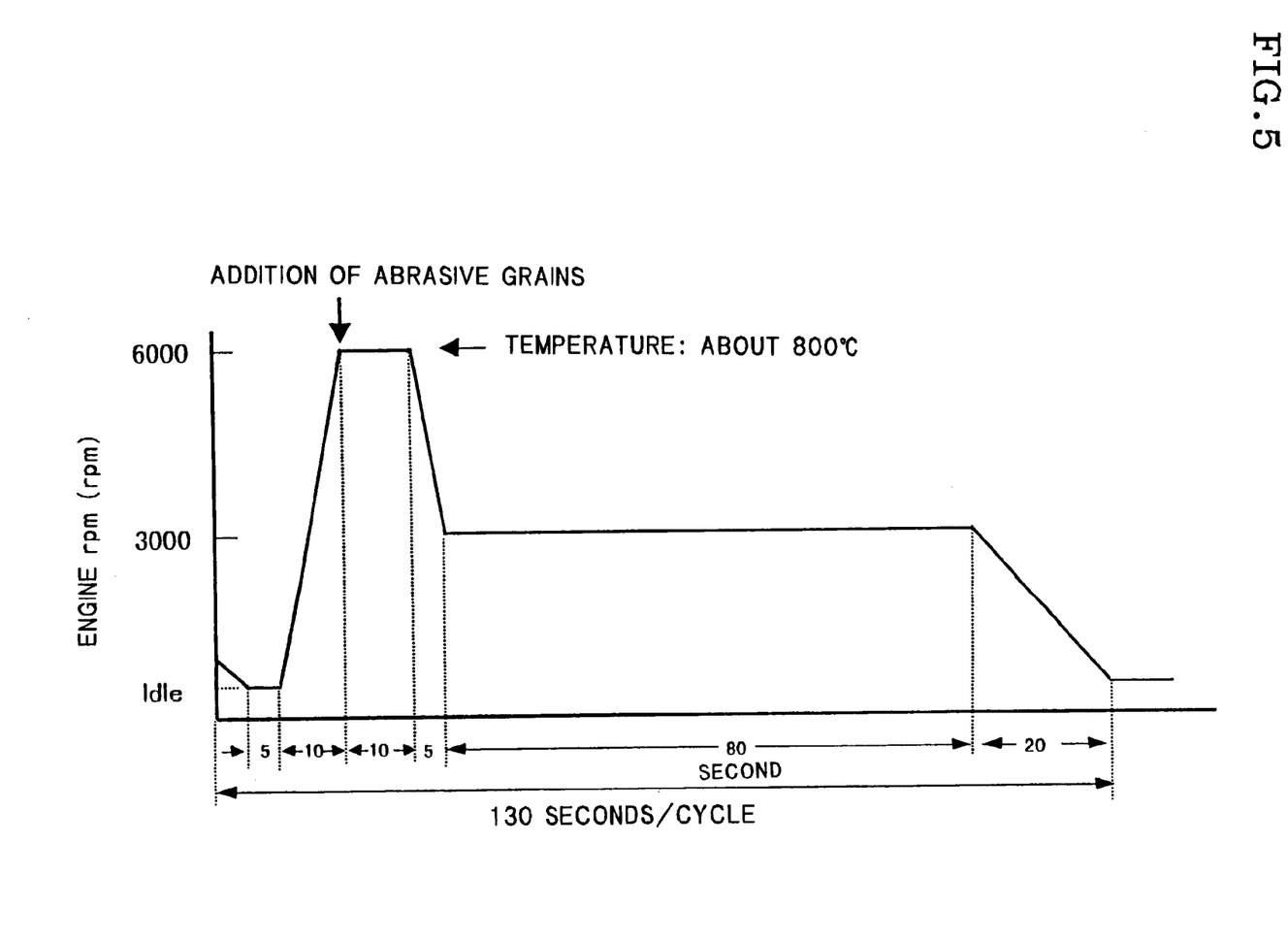
FIG. 5 is a graph showing the conditions of engine rpm in an erosion test.

A metallic can holding and accommodating a honeycomb structure was connected to the exhaust port of a gasoline engine of in-line four cylinders and 1.8 liters displacement. That is, a sample was placed right near the engine. Next, the engine was operated under the conditions shown in FIG. 5 and, when the engine rpm reached 6,000 rpm, 0.1 g of abrasive grains (silicon carbide, GC 320, average particle diameter: 50 μm) were added. Further, the engine operation was continued under the conditions shown in FIG. 5; once in each two cycles (one cycle: 130 seconds), abrasive grains were added; this was repeated continuously. Test was conducted several times by changing the total amount of abrasive grains added between about 2 g and 16 g, and from the results was calculated the erosion amount (wind erosion volume) of honeycomb structure when the amount of abrasive grains added was 10 g).

Figure 6:
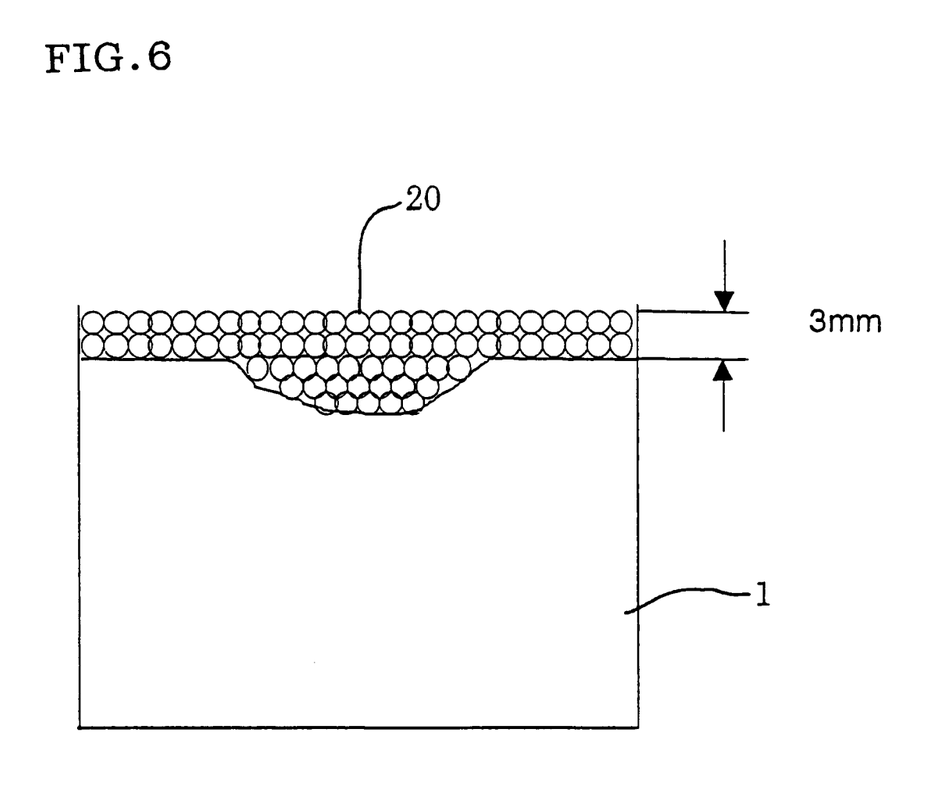
FIG. 6 is a drawing schematically showing a measurement method for erosion amount.

Erosion amount was measured by, as shown in FIG. 6, winding a rubber sheet round the end face of a honeycomb structure 1 whose erosion amount was to be measured, placing therein ceramic-made beads of 1.5 mm in diameter at a height of about 3 mm, then recovering them to measure the volume of beads, and calculating a difference between beads volume after erosion test and beads volume before the test. This was conducted three times and an average thereof was taken as erosion amount.

The results are shown in Table 2. Here, the bulk density of each honeycomb structure as an indication of heat capacity was calculated. The sample of Comparative Example 3 was good in erosion resistance but was high in bulk density and heat capacity. The sample of Comparative Example 4 was small in bulk density and heat capacity but was large in erosion amount and inferior in erosion resistance. In contrast, the samples of Examples 5 and 6 were low in erosion resistance and bulk density and improved in balance of erosion resistance and low heat capacity. In particular, the samples of Examples 5 and 6 and the sample of Comparative Example 4 were close in bulk density and heat capacity; however, the samples of Examples 5 and 6 showed a small erosion amount and the honeycomb structures of the present invention achieved a lower heat capacity and improved erosion resistance at a good balance.

TABLE 2

| | Cell density (cells/cm$^2$) | Basic cell wall thickness (mm) | Cell wall thickness of thick portion (mm) | Open frontal area (P) (%) | Porosity (%) | Erosion amount at added amount of 10 g (cm$^3$) | Bulk density (g/cm$^3$) |
|---|---|---|---|---|---|---|---|
| Ex. 5 | 140 | 0.066 | 0.066 | 85.1 | 28 | 2.0 | 0.291 |
| Ex. 6 | 140 | 0.062 | 0.062 | 85.9 | 26 | 3.8 | 0.283 |
| Comp. 3 | 140 | 0.086 | 0.086 | 80.7 | 35 | 1.8 | 0.336 |
| Comp. 4 | 140 | 0.071 | 0.071 | 83.9 | 35 | 5.0 | 0.284 |

Example 7 and Comparative Example 5

In Example 7 and Comparative Example 5, the honeycomb structures obtained in Example 6 and Comparative Example 4 were allowed to load a catalyst thereon and the resulting honeycomb structures were subjected to the same erosion resistance test as mentioned above. Catalyst loading was conducted by dipping the honeycomb structure in a solution containing active alumina and a noble metal as a catalyst, removing the excessive solution, and firing the honeycomb structure.

The results are shown in Table 3. In Example 7 and Comparative Example 5, erosion resistance improved owing to catalyst loading. However, the honeycomb structure (Example 7) of the present invention showed higher erosion resistance than the honeycomb structure of Comparative Example 5.

TABLE 3

| | Cell density (cells/cm$^2$) | Basic cell wall thickness (mm) | Cell wall thickness of thick portion (mm) | Open frontal area (P) (%) | Porosity (%) | Erosion amount at added amount of 10 g (cm$^3$) | Bulk density (g/cm$^3$) |
|---|---|---|---|---|---|---|---|
| Ex. 7 | 140 | 0.062 | 0.062 | 85.9 | 26 | 0.4 | 0.283 |
| Comp. 5 | 140 | 0.071 | 0.071 | 83.9 | 35 | 1.2 | 0.284 |

The samples obtained in Example 5 and Comparative Example 4 were measured for surface roughness according to the above method, and the results are shown in Table 4 together with that of Comparative Example 2. The samples were also measured for pore distribution according to the same method as mentioned above. The samples were further measured for canning property according to the following method.

A holding member (0.2 g/cm$^3$) was wound round a sample (a honeycomb structure); the resulting honeycomb structure was held by a SUS-made can, then pushed it out of the can; the highest load (N) at which the honeycomb structure was pushed out at 600° C. at a pushing speed of 1 mm/min, was measured and used as an indication of canning property.

The results are shown in Table 4. As seen from Table 4, the samples of Example 5 and Comparative Example 4 showed a Ra$_s$ of 0.5 μm or more and a RzDIN$_s$ of 5 μm or more and their pore distributions were such that pores having diameters of 1 μm or more were 90% by volume or more. Meanwhile, the sample of Comparative Example 2 showed Ra$_s$=0.4 and RzDIN$_s$=4, and its pore distribution was such that pores having diameters of 1 μm or more were 55% by volume. Further, the pushing strengths of the samples of Example 5 and Comparative Example 4 were high at 480 N and 510 N and showed good canning property; however, the sample of Comparative Example 2 was low in pushing strength at 205 N and inferior in canning property.

TABLE 4

|  | Ra$_s$ (μm) | RzDIN$_s$ (μm) | pushing load (N) |
|---|---|---|---|
| Ex. 5 | 1.7 | 11.9 | 480 |
| Comp. 4 | 1.8 | 12.8 | 510 |
| Comp. 2 | 0.4 | 4 | 205 |

Example 8 and Comparative Example 6

Next, there were produced, in the same manner as in Examples 1 to 4, samples (honeycomb structures such as shown in FIG. 2) in which the wall thickness of cells from the outermost peripheral cell to tenth cell extending inwardly therefrom were made larger than the basic cell wall thickness. A catalyst was loaded thereon in the same manner as mentioned above. The resulting samples were evaluated for erosion resistance in the same manner as mentioned above. The results are shown in Table 5. The sample (Example 8) of the present invention was very small (0.056 mm) in basic cell wall thickness but showed relatively good erosion resistance. The sample obtained in Comparative Example 6 was also small (0.055 mm) in basic cell wall thickness but showed relatively good erosion resistance. The latter sample had a cell wall thickness near the circumference, larger than that of Example 8 but showed a larger erosion amount than the sample of Example 8.

Examples 9 and 10

In the same manner as in Examples 1 to 4 were produced samples having a basic cell wall thickness of 0.047 mm, a cell wall thickness of 0.67 mm in the outermost peripheral cell to the 10th cell extending inwardly therefrom, and a porosity of 27%. They were allowed to load a catalyst thereon in the same manner as mentioned above and their porosities in the portion ranging from the end face (subjected to an exhaust gas) to a depth of 5 mm therefrom were reduced to 18% according to the following method. The resulting samples were evaluated for erosion resistance in the same manner as mentioned above.

Method for Reducing End Face Porosity

A sherd was mixed with water, a silica sol was mixed therewith, and a surfactant was mixed therewith to produce a slurry containing 60% by weight of water and 40% by weight of a component consisting of 90% by weight of a fine particle (1 to 2 μm) sherd solid, 10% by weight of a colloidal silica (silica sol: 30% by weight) solid and a small amount f a surfactant. Then, a honeycomb structure was dried in a drying machine at 150° C. for 1 hour or more, then taken out and measured for weight. The honeycomb structure was allowed to stand until the temperature became room temperature. Then, the slurry was filled in a container to a depth for end face reinforcement, and the honeycomb structure was immersed therein for 1 to 2 seconds in a state that the structure reached the bottom of the container. The honeycomb structure was lifted and shaken to drop some part of the slurry adhering thereto, after which the slurry remaining inside was removed by air blowing. After no cell plugging was confirmed, the honeycomb structure was dried by a hot blaster (about 130° C., an air speed of 2 m/sec, 3 minutes or more) and further dried (15° C. for 1 hour or more) in a drying machine. The resulting honeycomb structure was fired under the firing conditions mentioned above, whereby the porosity of end face was reduced.

The sample (Example 9) in which end face porosity was not reduced and the sample (Example 10) in which end face porosity was reduced, were subjected to an erosion resistance test. The results are shown in Table 6. When the basic cell wall thickness was 0.047 mm, the amount of erosion was fairly large (3.3 cm$^3$) even when the cell wall thickness near the circumference of honeycomb structure was made large; however, by reducing the porosity of end face, the amount of erosion was improved to 1.8 cm$^3$.

TABLE 5

|  | Cell density (cells/cm$^2$) | Basic cell wall thickness (mm) | Cell wall thickness of thick portion (mm) | Open frontal area (P) (%) | Porosity (%) | Erosion amount at added amount of 10 g (cm$^3$) |
|---|---|---|---|---|---|---|
| Ex. 8 | 140 | 0.056 | 0.072 | 86.3 | 27 | 1.0 |
| Comp. 6 | 140 | 0.055 | 0.081 | 85.9 | 35 | 1.8 |

TABLE 6

|  | Cell density (cells/cm²) | Basic cell wall thickness (mm) | Cell wall thickness of thick portion (mm) | Open frontal area (P) (%) | Porosity (%) | Erosion amount at added amount of 10 g (cm³) | Porosity of end face (%) |
|---|---|---|---|---|---|---|---|
| Ex. 9 | 140 | 0.047 | 0.067 | 88.6 | 27 | 3.3 | 27 |
| Ex. 10 | 140 | 0.047 | 0.067 | 88.6 | 27 | 1.8 | 18 |

INDUSTRIAL APPLICABILITY

As described above, the honeycomb structure of the present invention is improved in erosion resistance, low heat capacity and canning property at a good balance, and is useful as various filters and catalyst carriers, particularly as a carrier for catalyst for purification of automobile exhaust gas. Further, the process for producing a honeycomb structure according to the present invention can produce a honeycomb structure having a low porosity and an outer wall and/or a cell wall both of rough surface, easily and economically and is useful for production of a honeycomb structure having the above-mentioned properties (good erosion resistance, low heat capacity and good canning property).

What is claimed is:

1. A honeycomb structure constituted by porous cell walls which form a cell group consisting of a plurality of cells adjacent to each other, and a honeycomb outer wall which surrounds and holds the outermost peripheral cells located at a circumference of the cell group, characterized in that a porosity is 5% to less than 30%, a basic wall thickness ($T_c$) of the cell walls is 0.030 mm$\leq T_c<$0.076 mm, an average surface roughness ($Ra_s$) of the outer wall is 0.5 $\mu$m$\leq Ra_s\leq$10 $\mu$m, and/or an average height ($RzDIN_s$) on the surface of the outer wall from a local maximum point to a next local minimum point is 5 $\mu$m$\leq RzDIN_s\leq$50 $\mu$m.

2. A honeycomb structure according to claim 1, characterized in that the average surface roughness ($Ra_s$) is 0.5 $\mu$m$\leq Ra_s\leq$10 $\mu$m and the average height ($RzDIN_s$) from a local maximum point to a next local minimum point is 5 $\mu$m$\leq RzDIN_s\leq$50 $\mu$m.

3. A honeycomb structure according to claim 1, characterized in that the average surface roughness ($Ra_s$) is 1.0 $\mu$m$\leq Ra_s\leq$10 $\mu$m and the average height ($RzDIN_s$) from a local maximum point to a next local minimum point is 10 $\mu$m$\leq RzDIN_s\leq$50 $\mu$m.

4. A honeycomb structure according to claim 1, characterized in that an open frontal area (P) of the honeycomb structure is 83% or more.

5. A honeycomb structure according to claim 1, characterized in that an outer wall thickness (Ts) of the honeycomb structure is 0.076 mm or more.

6. A honeycomb structure according to claim 1, characterized in that an average surface pore diameter of the outer wall is larger than an average inside pore diameter of the outer wall.

7. A honeycomb structure according to claim 1, characterized in that an average surface roughness ($Ra_c$) of the cell walls is 0.5 $\mu$m$\leq Ra_c$10 $\mu$m and/or an average height ($RzDIN_c$) of the cell wall surfaces from a local maximum point to a next local minimum point is 5 $\mu$m$\leq RzDIN_c\leq$50 $\mu$m.

8. A honeycomb structure according to claim 1, characterized in that pores having diameters of 1 $\mu$m or more is 90% by volume or more of total pore volume.

9. A honeycomb structure according to claim 1, characterized in that there is a relation of $$1.10\leq(Tr_1\sim Tr_{5\text{-}20})/T_c\leq 3.00$$

between the basic cell wall thickness ($T_c$) and each cell wall thickness ($Tr_1\sim Tr_{5\text{-}20}$) of cells existing between an outermost peripheral cell taken as a first cell and also as a first starting cell and a first end cell which is any cell of a fifth cell to a twentieth cell all extending inwardly from the first starting cell.

10. A honeycomb structure according to claim 9, characterized in that there is a relation of $$1.10\leq(Tr_1\sim Tr_{5\text{-}15})/T_c\leq 3.00$$

between the basic cell wall thickness ($T_c$) and each cell wall thickness ($Tr_1\sim Tr_{5\text{-}15}$) of cells existing between an outermost peripheral cell taken as a first cell and also as a first starting cell and a first end cell which is any cell of a fifth cell to a fifteenth cell all extending inwardly from the first starting cell.

11. A honeycomb structure according to claim 9, characterized in that, taking a first cell inward from and adjacent to the first end cell as a second starting cell, cells existing between the second starting cell and a second end cell, which is any cell of a third cell to a fifth cell all extending inwardly from the second starting cell, have a cell wall thickness that is substantially uniform in each cell and gets smaller one by one inwardly and that the smallest cell wall thickness is identical to the basic cell wall thickness ($T_c$).

12. A honeycomb structure according to claim 9, characterized in that, taking a first cell inward from and adjacent to the first end cell as a second starting cell, cells existing between the second starting cell and a second end cell, which is any cell of a third cell to a fifth cell all extending inwardly from the second starting cell, have such a cell wall thickness that a sectional shape of each cell wall is inverse trapezoid and each cell wall thickness gets smaller inwardly and that the smallest cell wall thickness is identical to the basic cell wall thickness ($T_c$).

13. A honeycomb structure according to claim 9, characterized in that, taking a first cell inward from and adjacent to the first end cell as a second starting cell, cells existing between the second starting cell and a second end cell, which is any cell of a third cell to a fifth cell all extending inwardly from the second starting cell, have such a cell wall thickness that a sectional shape of each cell wall is spool and each cell wall thickness gets smaller inwardly and that the smallest cell wall thickness is identical to the basic cell wall thickness ($T_c$).

14. A honeycomb structure according to claim 9, characterized in that there is a relation of $$1.10 \leq Tr_1/T_c \leq 3.00$$

between the cell wall thickness ($Tr_1$) of outermost peripheral cell and the basic cell wall thickness ($T_c$), taking outermost peripheral cell as a third starting cell, there is a relation of $$1.10 \leq (Tr_1 \sim Tr_{5-20})/T_c \leq 3.00$$

between the basic cell wall thickness ($T_c$) and each cell wall thickness ($Tr_1 \sim Tr_{5-20}$) of cells existing between the third starting cell and a third end cell which is any cell of a fifth cell to a twentieth cell all extending inwardly from the third starting cell, the cells have a cell wall sectional shape of inverse trapezoid or spool or have a uniform cell wall thickness and their cell wall thicknesses get smaller as the cell is more inward, and the smallest cell wall thickness is identical to the basic cell wall thickness ($T_c$).

15. A honeycomb structure according to claim 9, characterized in that there is a relation of $$1.10 \leq (Tr_1 \sim Tr_{5-20}) \leq 2.50$$

between each cell wall thickness ($Tr_1 \sim Tr_{5-20}$) and the basic cell wall thickness ($T_c$).

16. A honeycomb structure according to claim 9, characterized in that there is a relation of $$1.20 \leq (Tr_1 \sim Tr_{5-20}) \leq 1.60$$

between each cell wall thickness ($Tr_1 \sim Tr_{5-20}$) and the basic cell wall thickness ($T_c$).

17. A honeycomb structure according to claim 9, characterized in that an area of a section of the honeycomb structure perpendicular to the axial direction is 160 cm² or more and there is a relation of $$1.10 \leq (Tr_1 \sim Tr_{10-40})/T_c 3.00 \leq$$

between the basic cell wall thickness ($T_c$) and each cell wall thickness ($Tr_1 \sim Tr_{10-40}$) of cells existing between an outermost peripheral cell taken as a first cell and also as a first starting cell and a first end cell which is any cell of a tenth cell to a fortieth cell all extending inwardly from the first starting cell.

18. A honeycomb structure according to claim 1, characterized in that a value of porosity (%) of part or all of the cell wall portions within 30 mm from one or both end faces of the honeycomb structure is smaller by at least 5 than a value of porosity (%) of other cell wall portion.

19. A honeycomb structure according to claim 18, characterized in that a length of the cell wall portions having a value of porosity lower by at least 5, from the honeycomb end face is not uniform.

20. A honeycomb structure according to claim 1, characterized in that a thickness of the cell walls at one or both end faces of the honeycomb structure is larger than a thickness of the cell walls at other portion.

21. A honeycomb structure according to claim 9, characterized in that the $T_c$ is $T_c \leq 0.056$ mm.

22. A honeycomb structure according to claim 1, characterized in that the B axis flexural strength is 0.8 MPa or more.

23. A honeycomb structure according to claim 1, characterized by being made of at least one kind of material selected from the group consisting of cordierite, alumina, mullite, silicon nitride, aluminum titanate, zirconia and silicon carbide.

24. A honeycomb structure according to claim 1, characterized in that a sectional shape of the honeycomb structure is circular, elliptical, oval, trapezoidal, triangular, tetragonal, hexagonal or asymmetrical between the right and the left.

25. A honeycomb structure according to claim 1, characterized in that a sectional shape of cells is triangular or hexagonal.

26. A honeycomb structure according to claim 1, characterized by being used as a carrier for catalyst for purification of automobile exhaust gas.

27. A honeycomb structure according to claim 1, characterized in that a catalyst component is loaded on the cell walls of the honeycomb structure, which is assembled into a catalytic converter, and held the outer wall at the outer surface.

28. A honeycomb structure according to claim 1, characterized by being formed so that an intersection of cell walls has a radius of curvature of 1.2 mm or less.

29. A honeycomb structure according to claim 1, characterized by being formed so that an intersection of a cell wall and a honeycomb outer wall has a radius of curvature of 1.2 mm or less.

30. A process for producing a honeycomb structure constituted by porous cell walls which form a cell group consisting of a plurality of cells adjacent to each other, and a honeycomb outer wall which surrounds and holds the outermost peripheral cells located at a circumference of the cell group, in which honeycomb structure a porosity is 5% to less than 30%, a basic wall thickness (Tc) of the cell walls is 0.030 mm $\leq$ Tc<0.076 mm, an average surface roughness ($Ra_s$) of the outer wall is 0.5 $\mu$m $\leq Ra_s \leq 10$ $\mu$m, and/or an average height ($RzDIN_s$) on the surface of the outer wall from a local maximum point to a next local minimum point is 5 $\mu$m $\leq RzDIN_s \leq 50$ $\mu$m, the process being characterized in that production is conducted using a raw material containing at least a talc component and a kaolin component, the talc component containing coarse particle talc having an average particle diameter of 7 $\mu$m or more and fine particle talc having an average particle diameter of ⅔ or less of that of the coarse particle talc, the kaolin component containing coarse particle kaolin having an average particle diameter of 7 $\mu$m or more and fine particle kaolin having an average particle diameter of ⅔ or less of that of the coarse particle kaolin.

* * * * *

UNITED STATES PATENT AND TRADEMARK OFFICE
CERTIFICATE OF CORRECTION

PATENT NO. : 6,764,743 B2
DATED : July 20, 2004
INVENTOR(S) : Yasushi Kato et al.

It is certified that error appears in the above-identified patent and that said Letters Patent is hereby corrected as shown below:

<u>Title page,</u>
Insert Item -- [30]   Foreign Application Priority Data
          May 1, 2001   (JP) ......................................... 2001-134732 --

Signed and Sealed this

Twenty-eighth Day of December, 2004

JON W. DUDAS
*Director of the United States Patent and Trademark Office*